US012609661B2

(12) United States Patent
Lin et al.

(10) Patent No.: US 12,609,661 B2
(45) Date of Patent: Apr. 21, 2026

(54) OUTPUT STAGE CIRCUIT ASSEMBLY FOR POWER AMPLIFIER SYSTEM WITH IMPROVED POWER MANAGEMENT

(71) Applicant: SKYWORKS SOLUTIONS, INC., Irvine, CA (US)

(72) Inventors: Yu-Jui Lin, Westlake Village, CA (US); Anise Muhammed Azizad, Porter Ranch, CA (US); Vignesh Sridharan, Thousand Oaks, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 676 days.

(21) Appl. No.: 17/965,259

(22) Filed: Oct. 13, 2022

(65) Prior Publication Data

US 2023/0124129 A1     Apr. 20, 2023

Related U.S. Application Data

(60) Provisional application No. 63/255,474, filed on Oct. 14, 2021.

(51) Int. Cl.
*H03F 3/24* (2006.01)

(52) U.S. Cl.
CPC ....... *H03F 3/245* (2013.01); *H03F 2200/102* (2013.01); *H03F 2200/414* (2013.01); *H03F 2200/451* (2013.01)

(58) Field of Classification Search
CPC .............. H03F 3/245; H03F 2200/102; H03F 2200/414; H03F 2200/451

USPC .......................................................... 330/295
See application file for complete search history.

(56) References Cited

U.S. PATENT DOCUMENTS

| | | | | |
|---|---|---|---|---|
| 10,651,798 | B2 * | 5/2020 | Soliman .................. | H03F 3/195 |
| 11,082,009 | B2 * | 8/2021 | Khlat ......................... | H03F 3/21 |
| 11,309,842 | B2 * | 4/2022 | Honda ...................... | H03F 1/56 |
| 2016/0112018 | A1 * | 4/2016 | Scuderi ................ | H03G 1/0029 |
| | | | | 330/295 |
| 2020/0328720 | A1 * | 10/2020 | Khlat ......................... | H03F 3/19 |
| 2021/0075369 | A1 * | 3/2021 | Honda ...................... | H03F 3/72 |

OTHER PUBLICATIONS

James M. Fiore, Common Collector Amplifier, LibreTexts Engineering, Chapter 7.4, UC Davis Library, the California State University. (Year: 2025).*

(Continued)

*Primary Examiner* — Hafizur Rahman
(74) *Attorney, Agent, or Firm* — Lando & Anastasi, LLP

(57) ABSTRACT

Examples of the disclosure include an output stage circuit assembly for a power amplifier system, the output stage circuit assembly comprising a plurality of output stage amplifiers connected in parallel to each other, each output stage amplifier of the plurality of output stage amplifiers configured to amplify an input signal of the output stage circuit assembly when turned on, and a controller configured to determine a number of output stage amplifiers to be turned off based on at least one of a voltage supplying mode for the power amplifier system or a power management mode of a device in which the power amplifier system is embedded, and to control the plurality of output stage amplifiers to be turned on or off according to the determined number of output stage amplifiers to be turned off.

20 Claims, 15 Drawing Sheets

(56) References Cited

OTHER PUBLICATIONS

Geoffrey Hunter, BJT Common Collector Amplifier, Published On: Sep. 2, 2022 (Year: 2022).*

Kenneth A. Kuhn, Common-Collector Amplifier Design, Oct. 8, 2005, rev. Jul. 26, 2009 (Year: 2009).*

* cited by examiner

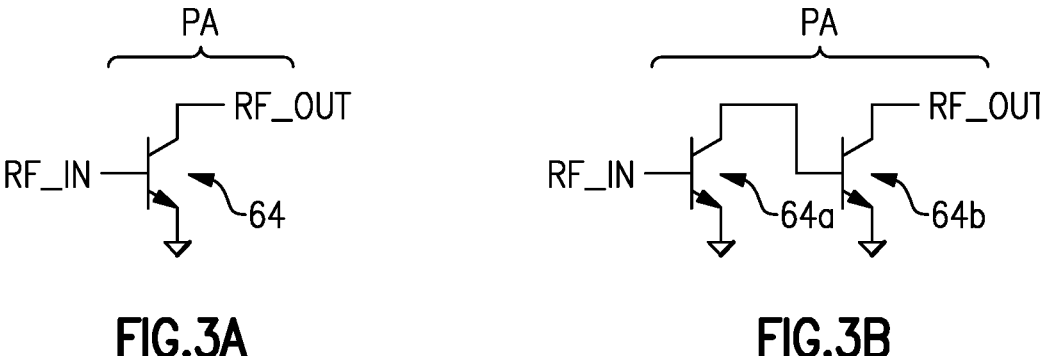
FIG.3A                FIG.3B
FIG.3C
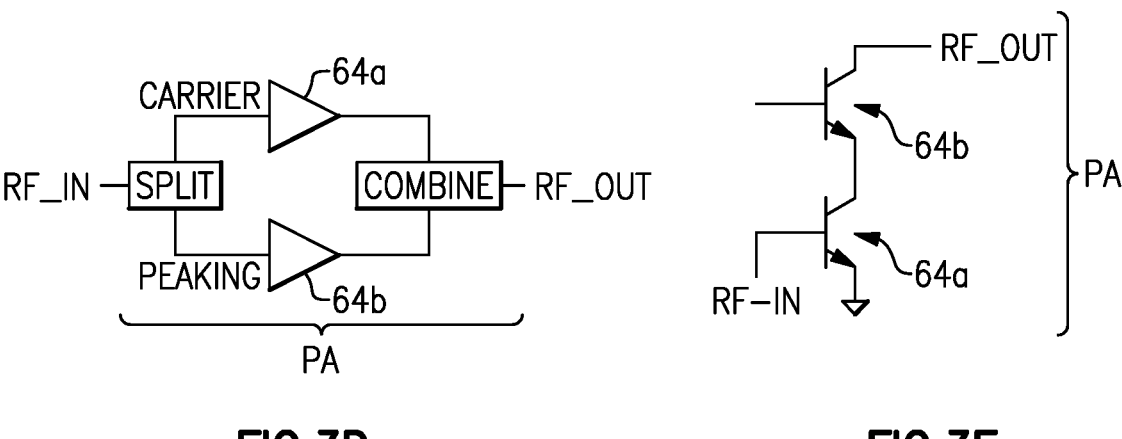
FIG.3D                FIG.3E

OUTPUT STAGE CIRCUIT ASSEMBLY FOR POWER AMPLIFIER SYSTEM WITH IMPROVED POWER MANAGEMENT

CROSS-REFERENCE TO RELATED APPLICATIONS

This application claims priority under 35 U.S.C. § 119(e) to U.S. Provisional Application Ser. No. 63/255,474, titled "OUTPUT STAGE CIRCUIT ASSEMBLY FOR POWER AMPLIFIER SYSTEM WITH IMPROVED POWER MANAGEMENT," filed on Oct. 14, 2021, which is hereby incorporated by reference in its entirety.

BACKGROUND

Field

Examples of the present disclosure relate to electronic systems, and in particular, to power amplifiers for use in radio-frequency (RF) electronics.

Description of the Related Technology

Power amplifiers are used in RF communication systems to amplify RF signals for transmission via antennas. It may be advantageous to manage the power of RF signal transmissions to prolong battery life and/or provide a suitable transmit power level.

Examples of RF communication systems with one or more power amplifiers include, but are not limited to, mobile phones, tablets, base stations, network access points, customer-premises equipment, laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for certain communications standards.

SUMMARY

According to at least one aspect of the present disclosure, an output stage circuit assembly for a power amplifier system is provided, the output stage circuit assembly comprising a plurality of output stage amplifiers connected in parallel to each other, each output stage amplifier of the plurality of output stage amplifiers configured to amplify an input signal of the output stage circuit assembly when turned on, and a controller configured to determine a number of output stage amplifiers to be turned off based on at least one of a voltage supplying mode for the power amplifier system or a power management mode of a device in which the power amplifier system is embedded, and to control the plurality of output stage amplifiers to be turned on or off according to the determined number of output stage amplifiers to be turned off.

In some examples, the voltage supplying mode is one of an average power tracking (APT) mode or an envelope tracking (ET) mode. In various examples, the controller is configured to determine to turn off more output stage amplifiers for the APT mode than the ET mode. In at least one example, the power management mode is one of a low power mode, a medium power mode, or a high power mode. In some examples, the controller is configured to determine to turn off more output stage amplifiers for a lower power consumption mode than a higher power consumption mode. In various examples, each output stage amplifier of the plurality of output stage amplifiers includes a transistor configured to amplify the input signal and a switch configured to operate the transistor.

In at least one example, each switch is a metal-oxide semiconductor having a source node connected to an input of the output stage circuit assembly, a drain node connected to a base of a respective transistor, and a gate connected to the controller. In some examples, each transistor includes a collector connected to a DC voltage bias node and an emitter connected to an output node of each output stage amplifier of the plurality of output stage amplifiers. In various examples, the output stage amplifiers of the plurality of output stage amplifiers are connected to each other via a first connection node at the input of the output stage circuit assembly, a second connection node at the DC voltage bias node, and a third connection node connected to an emitter of each transistor via a resistor.

According to at least one example of the disclosure, a radio-frequency module is provided comprising a packaging substrate configured to receive a plurality of components, a power amplifier system implemented on the packaging substrate, the power amplifier system including an output stage circuit assembly, the output stage circuit assembly including a plurality of output stage amplifiers connected in parallel to each other, each output stage amplifier of the plurality of output stage amplifiers configured to amplify an input signal of the output stage circuit assembly when turned on, and a controller configured to determine a number of output stage amplifiers to be turned off based on at least one of a voltage supplying mode for the power amplifier system or a power management mode of a device in which the power amplifier system is embedded, and to control the plurality of output stage amplifiers to be turned on or off according to the determined number of output stage amplifiers to be turned off.

In some examples, the radio-frequency module is a front-end module. In at least one example, the voltage supplying mode is one of an average power tracking (APT) mode or an envelope tracking (ET) mode. In various examples, the controller is configured to determine to turn off more output stage amplifiers for the APT mode than the ET mode. In some examples, the power management mode is one of a low power mode, a medium power mode, or a high power mode. In at least one example, the controller is configured to determine to turn off more output stage amplifiers for a lower power consumption mode than a higher power consumption mode. In various examples, each output stage amplifier of the plurality of output stage amplifiers includes a transistor configured to amplify the input signal and a switch configured to operate the transistor.

In some examples, the switch is a metal-oxide semiconductor having a source node connected to an input of the output stage circuit assembly, a drain node connected to a base of a respective transistor, and a gate connected to the controller. In at least one example, the transistor includes a collector connected to a DC voltage bias node and an emitter connected to an output node of each output stage amplifier of the plurality of output stage amplifiers. In various examples, the output stage amplifiers are connected to each other via a first connection node at the input of the output stage circuit assembly, a second connection node at the DC voltage bias node, and a third connection node connected to an emitter of the transistor via a resistor.

According to at least one example of the disclosure, a method of operating an output stage circuit assembly for a power amplifier system is provided, the output stage circuit assembly including a plurality of output stage amplifiers connected in parallel to each other, the method comprising amplifying, by each output stage amplifier of the plurality of output stage amplifiers responsive to being turned on, an input signal of the output stage circuit assembly, determining a number of output stage amplifiers to be turned off based on at least one of a voltage supplying mode for the power amplifier system or a power management mode of a device in which the power amplifier system is embedded, and controlling the plurality of output stage amplifiers to be turned on or off according to the determined number of output stage amplifiers to be turned off.

BRIEF DESCRIPTION OF THE DRAWINGS

FIGS. 3A-3E illustrate non-limiting examples of power amplifiers.

DETAILED DESCRIPTION

Figure 1:
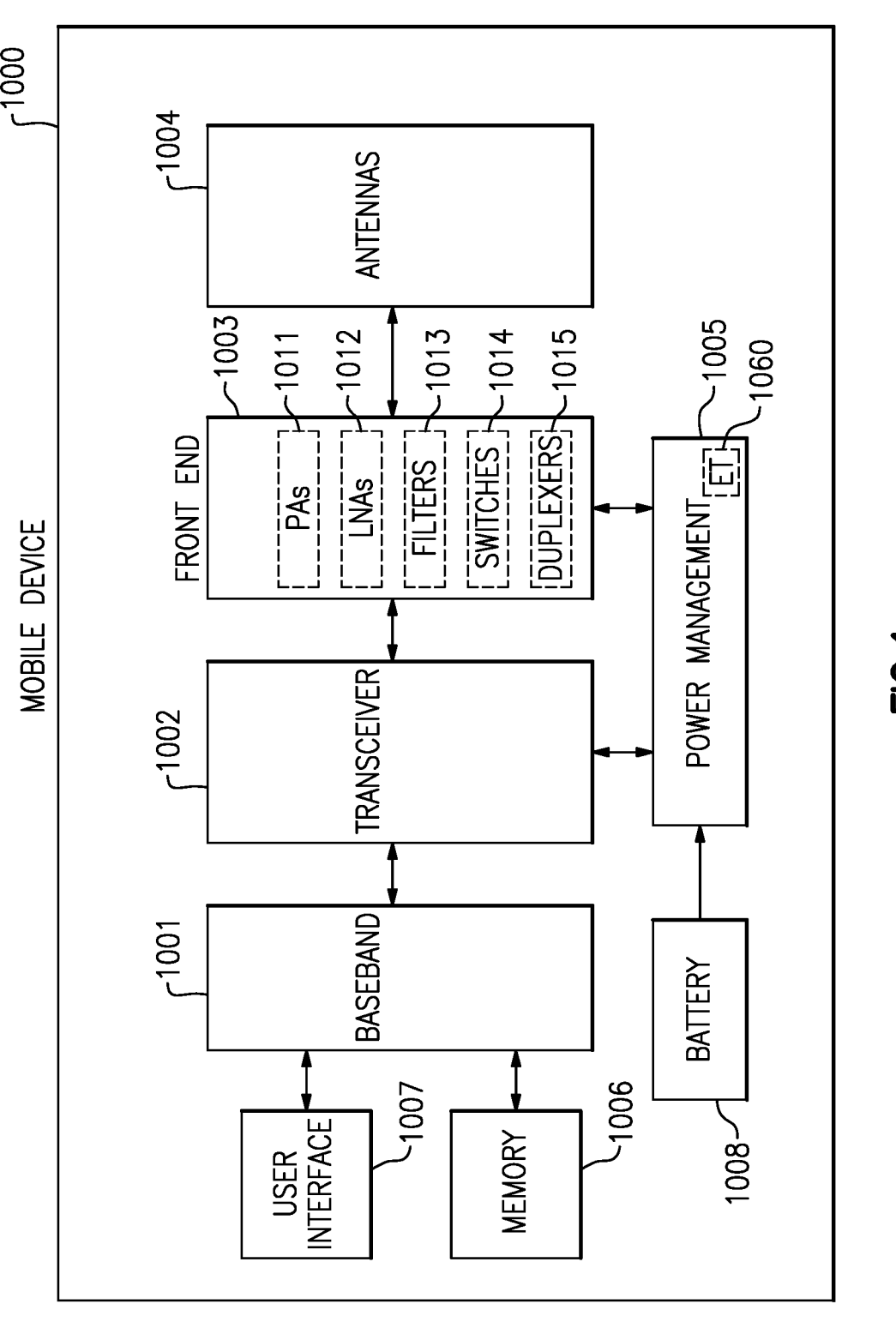
FIG. 1 illustrates a schematic diagram of one example of a mobile device.

The following detailed description of certain examples presents various descriptions of specific examples. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain examples can include more elements than illustrated in a drawing and/or a subset of the elements illustrated in a drawing. Further, some examples can incorporate any suitable combination of features from two or more drawings.

FIG. 1 illustrates a schematic diagram of one example of a mobile device 1000. The mobile device 1000 includes a baseband system 1001, a transceiver 1002, a front-end system 1003, antennas 1004, a power management system 1005, a memory 1006, a user interface 1007, and a battery 1008.

The mobile device 1000 can be used to communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and Zig-Bee), WMAN (for instance, WiMax), and/or GPS technologies.

The transceiver 1002 generates RF signals for transmission and processes incoming RF signals received from the antennas 1004. Various functionalities associated with the transmission and receiving of RF signals may be achieved by one or more components that are collectively represented in FIG. 1 as the transceiver 1002. In one example, separate components (for instance, separate circuits or dies) can be provided for handling certain types of RF signals.

The front-end system 1003 aids in conditioning signals transmitted to and/or received from the antennas 1004. In the illustrated example, the front-end system 1003 includes power amplifiers (PAs) 1011, low noise amplifiers (LNAs) 1012, filters 1013, switches 1014, and duplexers 1015. However, other implementations are possible.

For example, the front-end system 1003 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1000 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 1004 can include antennas used for a wide variety of types of communications. For example, the antennas 1004 can include antennas configured to transmit and/or receive signals associated with a wide variety of frequencies and communications standards.

In certain implementations, the antennas 1004 support MIMO communications and/or switched diversity communications. For example, MIMO communications use multiple antennas for communicating multiple data streams over a single radio-frequency channel. MIMO communications benefit from higher signal-to-noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1000 can operate with beamforming in certain implementations. For example, the front-end system 1003 can include phase shifters having variable phase controlled by the transceiver 1002. Additionally, the phase shifters can be controlled to provide beam formation and directivity for transmission and/or reception of signals using the antennas 1004. For example, in the context of signal transmission, the phases of the transmit signals provided to the antennas 1004 can be controlled such that radiated signals from the antennas 1004 combine using constructive and destructive interference to generate an aggregate transmit signal exhibiting beam-like qualities with more signal strength propagating in a given direction. In the context of signal reception, the phases can be controlled such that more signal energy is received when the signal is arriving to the antennas 1004 from a particular direction. In certain implementations, the antennas 1004 include one or more arrays of antenna elements to enhance beamforming.

The baseband system 1001 is coupled to the user interface 1007 to facilitate processing of various user input and output (I/O), such as voice and data. The baseband system 1001 provides the transceiver 1002 with digital representations of transmit signals, which the transceiver 1002 processes to generate RF signals for transmission. The baseband system 1001 also processes digital representations of received signals provided by the transceiver 1002. As shown in FIG. 1, the baseband system 1001 is coupled to the memory 1006 to facilitate operation of the mobile device 1000.

The memory 1006 can be used for a wide variety of purposes, such as storing data and/or instructions to facilitate the operation of the mobile device 1000 and/or to provide storage of user information.

The power management system 1005 provides a number of power management functions of the mobile device 1000. The power management system 1005 of FIG. 1 includes an envelope tracker 1060. As shown in FIG. 1, the power management system 1005 receives a battery voltage from the battery 1008. The battery 1008 can be any suitable battery for use in the mobile device 1000, including, for example, a lithium-ion battery.

The mobile device 1000 of FIG. 1 illustrates one example of an RF communication system that can include power amplifier(s) implemented in accordance with one or more features of the present disclosure. However, the teachings herein are applicable to RF communication systems implemented in a wide variety of ways.

Figure 2:
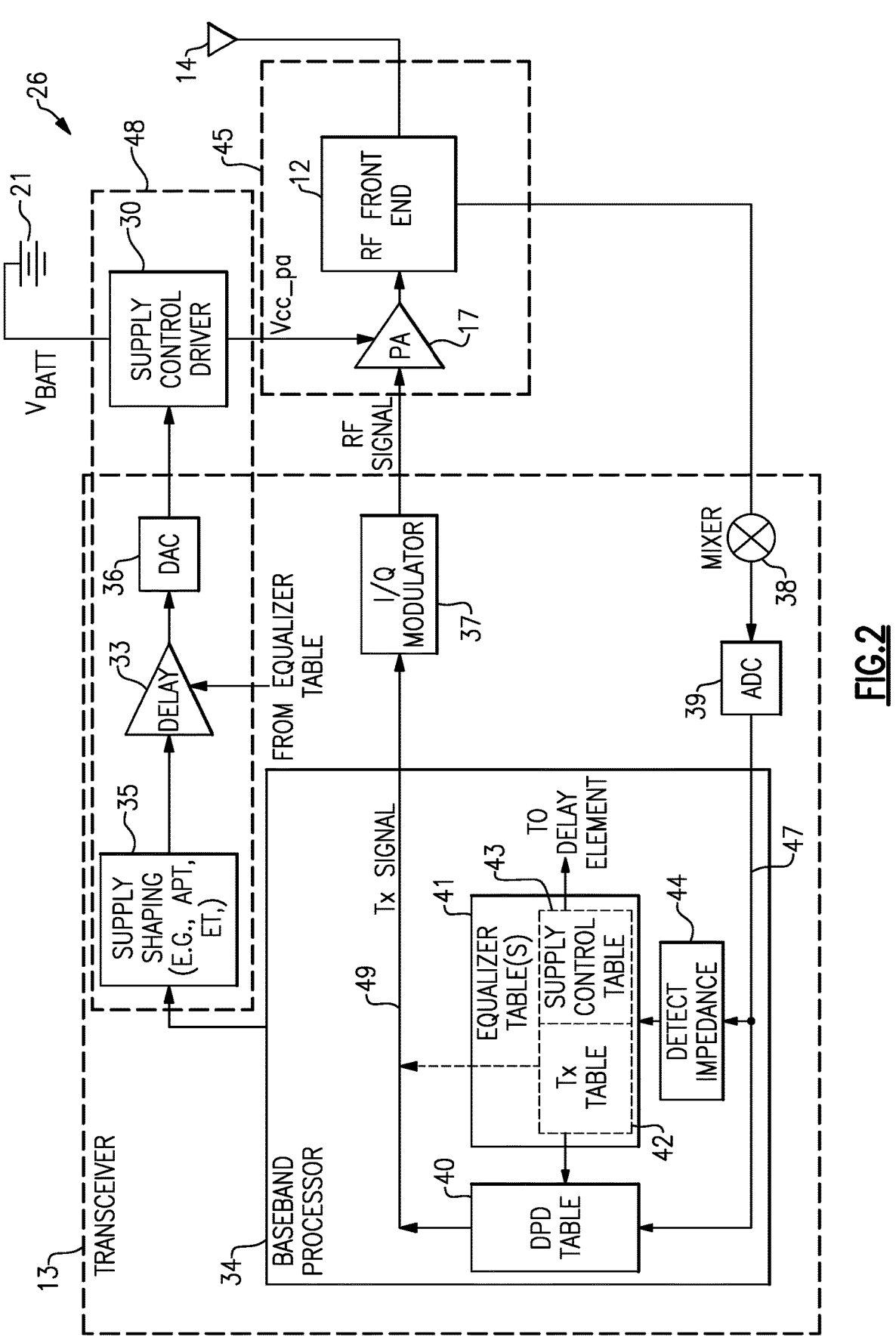
FIG. 2 illustrates a detailed block diagram of one example of a power amplifier system.

FIG. 2 illustrates a detailed block diagram of one example of a power amplifier system 26. For example, the power amplifier system 26 may be incorporated into the mobile device 1000. The illustrated power amplifier system 26 includes an RF front end 12, an antenna 14, a battery 21, a supply control driver 30, a power amplifier 17, and a transceiver 13. The illustrated transceiver 13 includes a baseband processor 34, a supply shaping block or circuit 35, a delay component 33, a digital-to-analog converter (DAC) 36, a quadrature (I/Q) modulator 37, a mixer 38, and an analog-to-digital converter (ADC) 39. The supply shaping block 35, delay component 33, DAC 36, and supply control driver 30 together form a supply shaping branch 48.

The baseband processor 34 can be used to generate an I signal and a Q signal, which correspond to signal components of a sinusoidal wave or a signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For example, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate an RF signal. For example, the I/Q modulator 37 can include DACs configured to convert the I and Q signals into an analog format, mixers for upconverting the I and Q signals to radio frequency, and a signal combiner for combining the upconverted I and Q signals into an RF signal suitable for amplification by the power amplifier 17. In certain implementations, the I/Q modulator 37 can include one or more filters configured to filter frequency content of signals processed therein.

The supply-shaping block 35 can be used to convert an envelope or amplitude signal associated with the I and Q signals into a shaped power supply control signal, such as an average power tracking (APT) signal or an envelope-tracking (ET) signal, depending on the example. Shaping the envelope signal from the baseband processor 34 can aid in enhancing performance of the power amplifier system 26. In certain implementations, such as where the supply shaping block is configured to implement an ET function, the supply shaping block 35 may be a digital circuit configured to generate a digital shaped envelope signal, and the DAC 36 may be used to convert the digital shaped envelope signal into an analog shaped envelope signal suitable for use by the supply control driver 30. However, in other implementations, the DAC 36 can be omitted in favor of providing the supply control driver 30 with a digital envelope signal to aid the supply control driver 30 in further processing of the envelope signal.

Figure 8A:
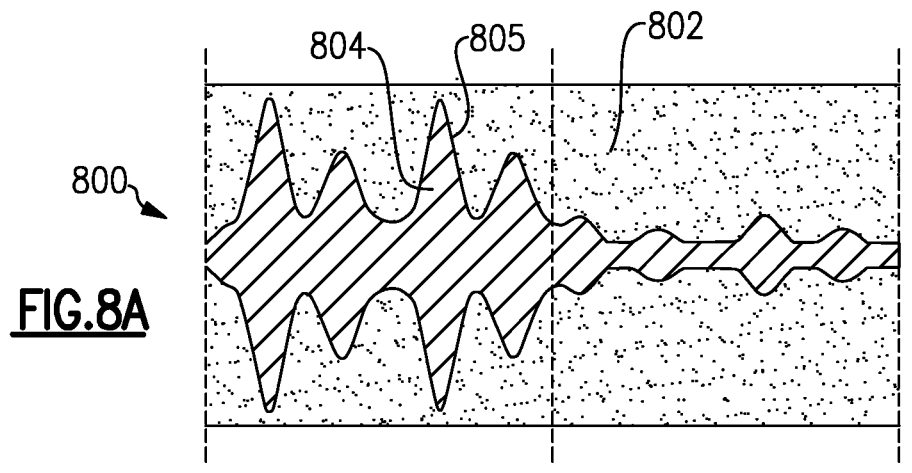
FIGS. 8A-8C illustrate example of waveforms for power amplifiers operating in a fixed supply voltage mode, an APT mode, and an ET mode.
Figure 8B:
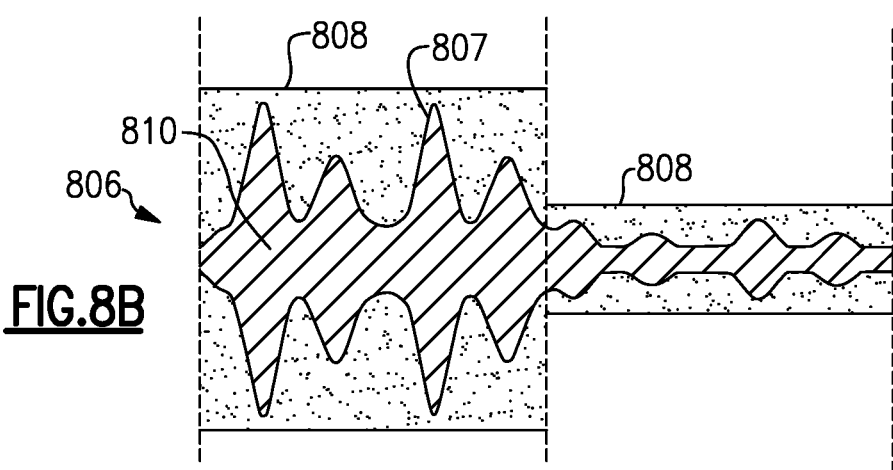
Figure 8C:
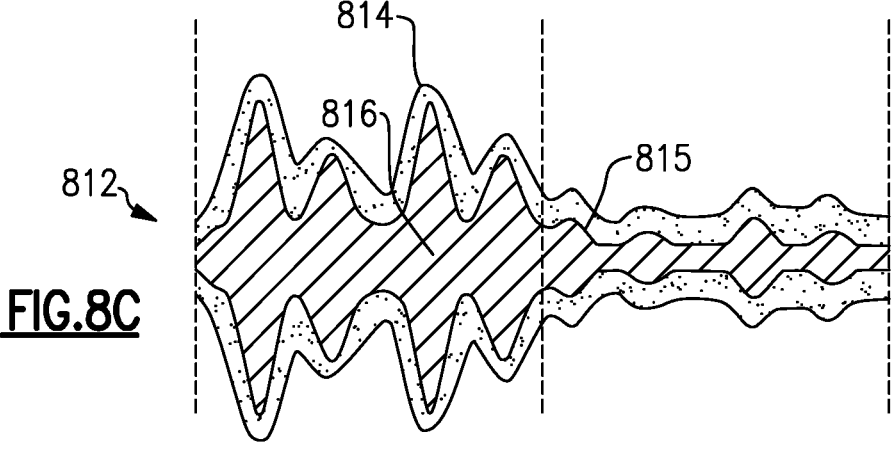

The supply control driver 30 can receive the supply control signal (for example, an analog shaped envelope signal or APT signal) from the transceiver 13 and a battery voltage VBATT from the battery 21, and can use the supply control signal to generate a power amplifier supply voltage VCC_PA for the power amplifier 17 that changes in relation to the transmit signal. The power amplifier 17 can receive the RF transmit signal from the I/Q modulator 37 of the transceiver 13, and can provide an amplified RF signal to the antenna 14 through the RF front end 12. In other cases, a fixed power amplifier supply voltage VCC_PA is provided to the power amplifier 17. In some such examples, one or more of the supply shaping block 35, DAC 36, and supply control driver 30 may not be included. Exemplary waveforms of power amplifier supply voltage VCC_PA and corresponding RF transmit signals are shown in FIGS. 8A, 8B, and 8C for fixed supply, APT, and ET power supply control operations, respectively. In some examples, the power amplifier system 26 is capable of performing two or more supply-control techniques. For instance, the power amplifier system 26 allows for selection (for example, via firmware programming or other appropriate mechanism) of two or more of ET, APT, and fixed power supply control modes. In such cases, the baseband processor or other appropriate controller or processor may instruct the supply shaping block 35 to enter into the appropriate selected mode.

The delay component 33 implements a selectable delay in the supply control path. As will be described in further detail, this can be useful in some cases for compensating for non-linearities and/or other potential sources of signal degradation. The illustrated delay component is shown in the digital domain as part of the transceiver 13, and may comprise a FIFO or other type of memory-based delay element. However, the delay component 33 can be implemented in any appropriate fashion, and in other examples may be integrated as part of the supply shaping block 35, or may be implemented in the analog domain, after the DAC 36, for example.

The RF front end 12 receives the output of the power amplifier 17, and can include a variety of components including one or more duplexers, switches (for example, formed in an antenna switch module), directional couplers, and so forth.

The directional coupler (not shown) within the RF front end 12 can be a dual directional coupler or other appropriate coupler or other device capable of providing a sensed output signal to the mixer 38. According to certain examples, including the illustrated example, the directional coupler is capable of providing both incident and reflected signals (for example, forward and reverse power) to the mixer 38. For instance, the directional coupler can have at least four ports, which may include an input port configured to receive signals generated by the power amplifier 17, an output port coupled to the antenna 14, a first measurement port configured to provide forward power to the mixer 38, and a second measurement port configured to provide reverse power to the mixer 38.

The mixer 38 can multiply the sensed output signal by a reference signal of a controlled frequency (not illustrated in FIG. 2) so as to downshift the frequency spectrum of the sensed output signal. The downshifted signal can be provided to the ADC 39, which can convert the downshifted signal to a feedback signal 47 in a digital format suitable for processing by the baseband processor 34. As will be discussed in further detail, by including a feedback path between the output of the power amplifier 17 and an input of the baseband processor 34, the baseband processor 34 can be configured to dynamically adjust the I and Q signals and/or power control signal associated with the I and Q signals to optimize the operation of the power amplifier system 26. For example, configuring the power amplifier system 26 in this manner can aid in controlling the power added efficiency (PAE) and/or linearity of the power amplifier 32. The mixer 38, ADC 39 and/or other appropriate components may generally perform a quadrature (I/Q) demodulation function in some examples.

Although the power amplifier system 26 is illustrated as including a single power amplifier, the teachings herein are applicable to power amplifier systems including multiple power amplifiers, including, for example, multi-mode and/or multi-mode power amplifier systems.

Additionally, although FIG. 2 illustrates a particular configuration of a transceiver, other configurations are possible, including for example, configurations in which the transceiver 13 includes more or fewer components and/or a different arrangement of components.

As shown the baseband processor 34 can include a digital pre-distortion (DPD) table 40, an equalizer table 41, and a complex impedance detector 44. The DPT table 40 may be stored in a non-volatile memory (for example, flash memory, read-only memory [ROM], and so forth) of the transceiver 34 that is accessible by the baseband processor 34. According to some examples, the baseband processor 34 accesses entries in the DPD table 40 to aid in linearizing the power amplifier 17. For instance, the baseband processor 34 selects appropriate entries in the DPD table 40 based on the sensed feedback signal 47, and adjusts the transmit signal accordingly, prior to outputting the transmit signal to the I/Q modulator 37. For example, DPD can be used to compensate for certain nonlinear effects of the power amplifier 17, including, for example, signal constellation distortion and/or signal spectrum spreading. According to certain examples including the illustrated example, the DPD table 40 implements memoryless DPD, for example, where the current output of the DPD corrected transmit signal depends only on the current input.

For the purpose of description, the PA of FIG. 2 can be implemented in a number of ways. FIGS. 3A-3E show non-limiting examples of how such a PA can implemented.

FIG. 3A illustrates an example PA having an amplifying transistor 64, where an input RF signal (RF_IN) is provided to a base of the transistor 64, and an amplified RF signal (RF_OUT) is output through a collector of the transistor 64.

FIG. 3B illustrates an example PA having a plurality of amplifying transistors (for example, a first transistor 64a and a second transistor 64b) arranged in stages. An input RF signal (RF_IN) is provided to a base of the first transistor 64a, and an amplified RF signal from the first transistor 64a is output through its collector. The amplified RF signal from the first transistor 64a is provided to a base of the second transistor 64b, and an amplified RF signal from the second transistor 64b is output through its collector to thereby yield an output RF signal (RF_OUT) of the PA.

In some examples, the foregoing example PA configuration of FIG. 3B can be depicted as two or more stages as shown in FIG. 3C. The first stage 64a can be configured as, for example, a driver stage, and the second stage 64b can be configured as, for example, an output stage.

FIG. 3D illustrates that in some examples, a PA can be configured as a Doherty PA. Such a Doherty PA can include amplifying transistors 64a, 64b configured to provide carrier amplification and peaking amplification of an input RF signal (RF_IN) to yield an amplified output RF signal (RF_OUT). The input RF signal can be split into the carrier portion and the peaking portion by a splitter. The amplified carrier and peaking signals can be combined to yield the output RF signal by a combiner.

FIG. 3E illustrates that in some examples, a PA can be implemented in a cascode configuration. An input RF signal (RF_IN) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_OUT) of the PA.

In the various examples of FIGS. 3A-3E, the amplifying transistors are shown as bipolar junction transistors (BJTs) such as heterojunction bipolar transistors (HBTs). One or more features of the present disclosure can also be implemented in or with other types of transistors such as field-effect transistors (FETs).

The ET technique is one of the most suitable solutions when considering both linearity and efficiency. The ET technique improves the efficiency by modulating the drain voltage of the PA according to the envelope of the input signal. Meanwhile, APT is also a widely-implemented approach to reduce unnecessary power consumption in RF PAs. Despite the various advantages of the ET technique, such as improved linearity, the APT technique still has its own advantage in terms of efficiency of the power amplifier system, particularly in the context of a low output voltage. The APT technique offers acceptable results for low output power and the ET technique improves efficiency at high output power and high PAPR. Thus, it may be advantageous to selectively determine a voltage-supplying mode (ATP or ET) for the power amplifier system based on the level of output power.

Meanwhile, in light of enhancing power consumption efficiency of a mobile device, different power management modes can be selectively adapted. For example, a high-power mode, a medium-power mode, and a low-power mode can be adapted. The number of different management modes is not limited thereto. Each power management mode can be combined with APT mode or ET mode.

In accordance with an aspect of the present disclosure, an output stage circuit assembly for a power amplifier system with reduced power consumption is provided herein.

Figure 4:
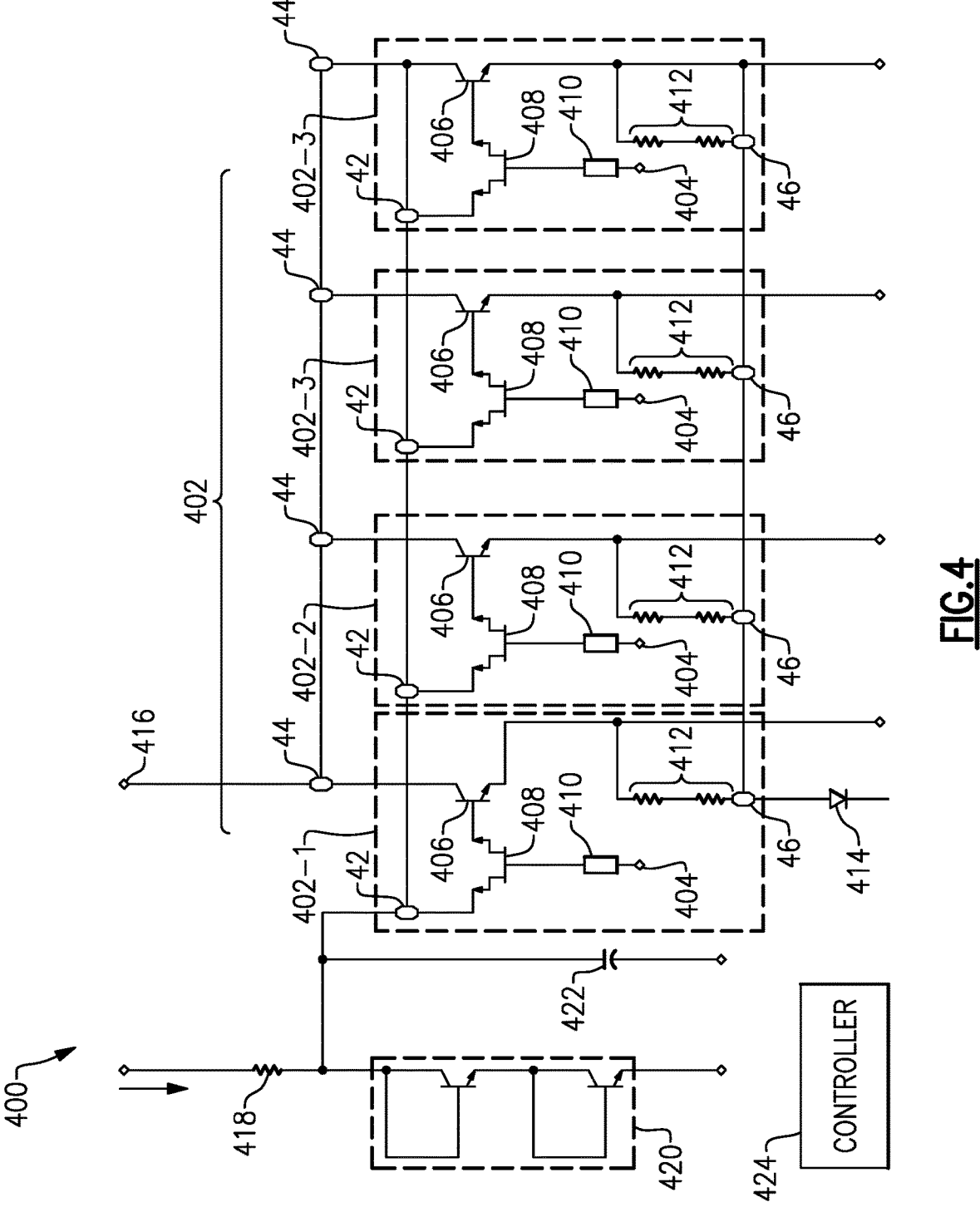
FIG. 4 illustrates a schematic diagram of one example of an output stage circuit assembly for a power amplifier system.

FIG. 4 illustrates a schematic diagram of one example of an output stage circuit assembly 400 for a power amplifier system in accordance with the present disclosure. The output stage circuit assembly 400 can be operated as an output stage of the power amplifier system. That is, the output stage circuit assembly 400 according to an example can be embedded in the power amplifier system. A plurality of output stage circuit assemblies can be embedded in a power amplifier system.

As shown in FIG. 4, the output stage circuit assembly 400 includes a plurality of output stage amplifiers 402 (402-1, 402-2, 402-3, 402-4) and a controller 424. As noted above, a baseband processor or other appropriate controller or processor may instruct the supply shaping block 35 to enter into an appropriate selected mode. In various examples, the controller 424 may be, include, or be included by this baseband processor or other appropriate controller or processor.

The output stage amplifiers 402 are connected in parallel to each other. Each of the output stage amplifiers 402 has multiple connection nodes, and the output stage amplifiers 402 are connected via the connection nodes. Each of the output stage amplifiers can be turned on or off by the controller 424. According to an example, when some of the output stage circuit assembly 402 is turned off, a current input from an input node of the output stage circuit assembly can flow through the rest of the output stage circuit assembly 402 that is turned on. The output stage amplifiers 402 are identical; as such, each of the plurality of output stage amplifiers 402 has the same characteristic and the same size. The number of output stage amplifiers in a single output stage circuit assembly may be same as the number of different operating mode of the mobile device. For example, the number of output stage amplifiers may be four. Each of the output stage amplifiers 402 has an input node and an output node. The input nodes of the plurality of output stage amplifiers 402 are connected to each other. The output stage amplifiers 402 are configured to amplify an input signal of the output stage circuit assembly 400 when the output stage amplifier 402 is turned on. The output stage amplifier 402 includes a transistor 406 configured to amplify an input signal of the output stage circuit assembly 400 and a switch 408 configured to operate the transistor 406. The switch 408 may receive a control signal from the controller 424 via a control node 404. Described connections to the controller 424 may not be illustrated for purposes of clarity. The control signal may indicate on-state or off-state. When the control signal indicates an on-state, the switch 408 is turned on and operates the transistor 406. In this case, the output stage amplifier 402 is described as being turned on. When the control signal indicates the off-state, the switch 408 is turned off and the transistor 406 remains in an off-state. In this case, the output stage amplifier 402 is described as being turned off.

The transistor 406 of the output stage amplifier 402 may be a BJT such as a heterojunction bipolar transistor (HBT). The switch 408 of the output stage amplifier 402 may be, for example, a metal-oxide semiconductor (MOS) transistor.

The transistor 406 has a collector connected to a DC voltage bias node 416, an emitter connected to an output of the output stage amplifier 402. The switch 408 may be a MOS having a source node connected to an input of the output stage circuit assembly 400, a drain node connected to a base of the transistor 406, and a gate connected to the controller 424.

The output stage amplifier 402 may further include a plurality of resistors. For example, the control node 404 is connected to a gate of the switch 408 via a resistor 410. For example, the emitter of transistor 406 is connected to a resistor 412. The resistor 412 may have a node at a point along the resistor 412.

The output stage amplifiers 402 are connected to each other via a first connection node 42, a second connection node 44, and a third connection node 46. The first connection node 42 is positioned at the input node of the output stage circuit assembly 400. The input node of the output stage circuit assembly may be connected to a resistor 418, a series of transistors 420, and a capacitor 422, in parallel. The second connection node 44 is positioned at the DC voltage bias node 416. The third connection node 46 is connected to the emitter of the transistor 406 via a resistor 412. The third connection node 46 is connected to a ground via a diode 414. The third connection node may be connected to an anode of the diode 414.

The controller 424 is configured to determine a number of output stage amplifiers 402 to be turned off based on at least one of a voltage-supplying mode for the power amplifier system and a power management mode. The voltage supplying mode may be the APT mode or ET mode. The controller 424 is configured to determine to turn off more output stage amplifiers for the APT mode than for the ET mode. The power management mode may be a low power mode (LPM), a medium power mode (MPM), or a high power mode (HPM). The power management mode may be adapted to a device with which the output stage circuit assembly is embedded. The controller 424 may be configured to determine to turn off more output stage amplifiers for a lower power consumption mode than a higher power management mode. The voltage supplying mode and the power management mode can be switched automatically or configured by a user of the device.

The controller 424 may be configured to control the plurality of output stage amplifiers to be turned on or off according to the determined number of output stage amplifiers to be turned off. When the number of output stage amplifier to be turned off is determined, the specific output stage amplifier to be turned off can be determined by pre-configuration or determined randomly. The controller 424 may output the control signals indicating on-state or off-state to the switches 408 of each of the plurality of output stage amplifiers 402.

According to an example of the present disclosure, the number of output stage circuit amplifiers to be turned on is determined depending on a combination of the voltage supplying mode and power management mode. The combination can include one of, for example, ET mode/HPM mode (ET HPM mode), ET mode/MPM mode (ET MPM mode), APT mode/HPM (APT HPM mode), and APT mode/

LPM mode (APT LPM mode). However, the combination of the voltage supplying mode and power management mode is not limited thereto.

According to this example, the controller 424 may determine the number of output stage amplifiers to be turned off as zero in ET HPM mode. In this case, all of the output stage amplifiers illustrated in FIG. 4 can be turned on.

The controller 424 may determine the number of output stage amplifiers to be turned off as one in ET MPM mode. In this case, the output stage amplifier 402-4 may be turned off.

The controller 424 may determine the number of output stage amplifiers to be turned off as two in APT HPM mode. In this case, the output stage amplifiers 402-3, 402-4 may be turned off.

The controller 424 may determine the number of output stage amplifiers to be turned off as three in APT LPM mode. In this case, the output stage amplifiers 402-2, 402-3, 402-4 may be turned off.

By turning off unnecessary output stage amplifiers, the power consumption of the power amplifier system can be improved, without degradation of other performance characteristics.

FIGS. 5A-5H illustrate examples of one example of performance characteristics measured from the power amplifier system operating in ET HPM mode. Traces 5a and 5b represent performance characteristics of the PA according to an example (trace 5a, the thicker line) and a baseline PA (trace 5b, the thinner line), respectively. The baseline PA is a power amplifier system that is not equipped with the output stage circuit assembly according to the present disclosure.

Figure 5A:
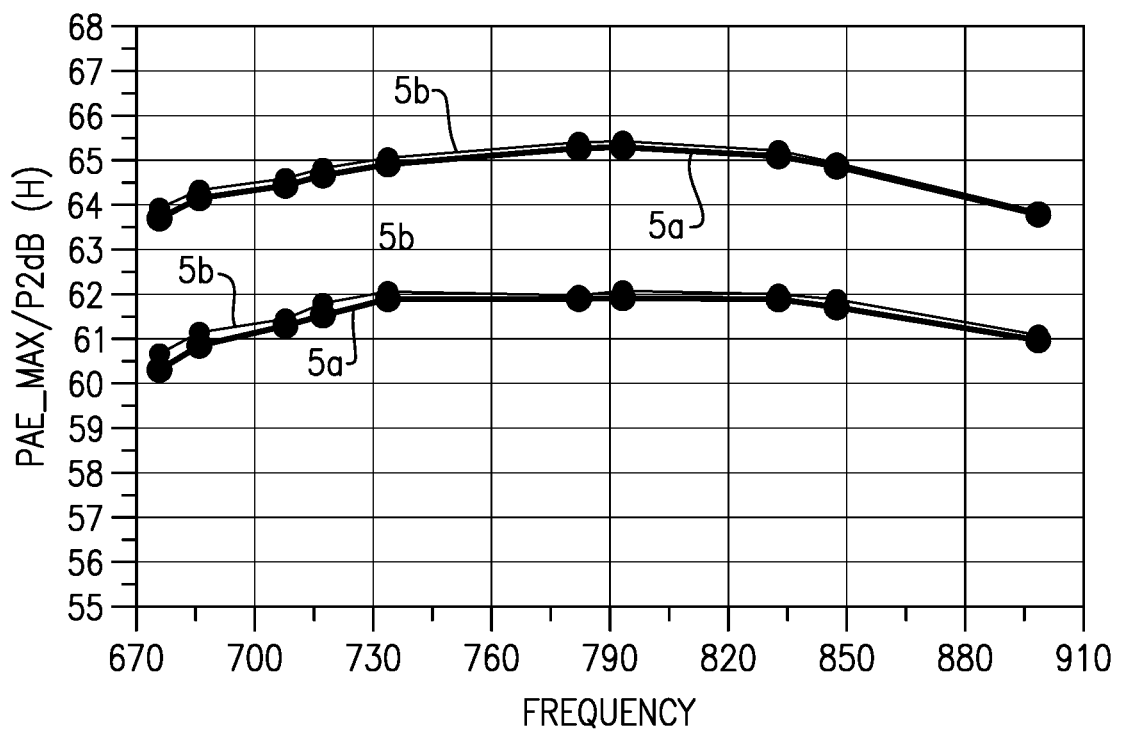
FIGS. 5A-5H illustrate examples of one example of performance characteristics measured from the power amplifier system operating in an envelope tracking (ET) high-power mode (HPM).

FIG. 5A illustrates an example of a PAE of a power amplifier system operating in ET HPM mode according to an example in comparison with the baseline PA.

Figure 5B:
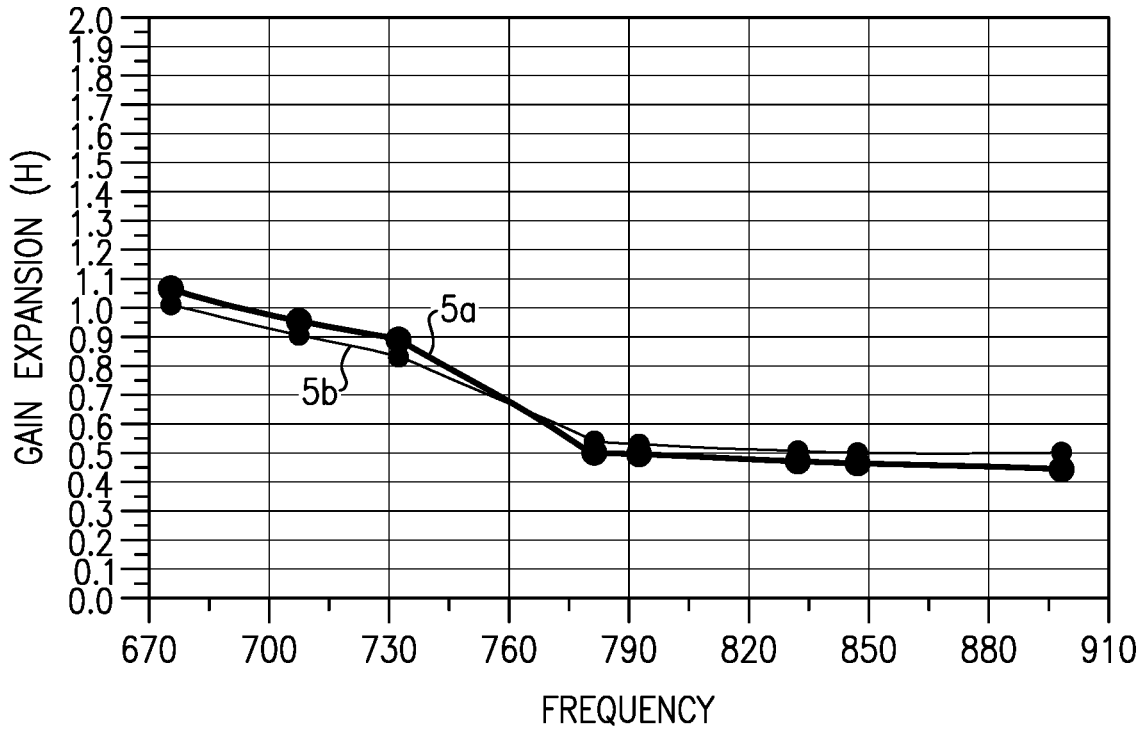

FIG. 5B illustrates an example of a gain expansion of a power amplifier system operating in ET HPM mode according to an example in comparison with a baseline PA.

Figure 5C:
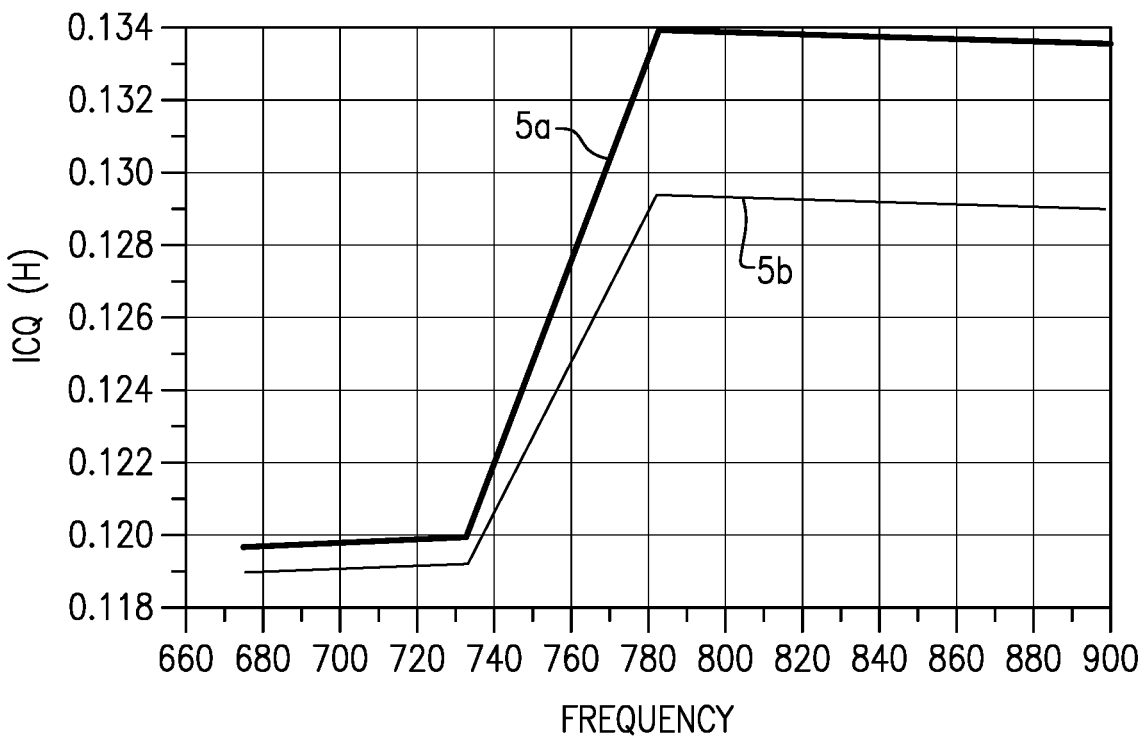

FIG. 5C illustrates an example of ICQ of a power amplifier system operating in ET HPM mode according to an example in comparison with a reference PA.

Figure 5D:
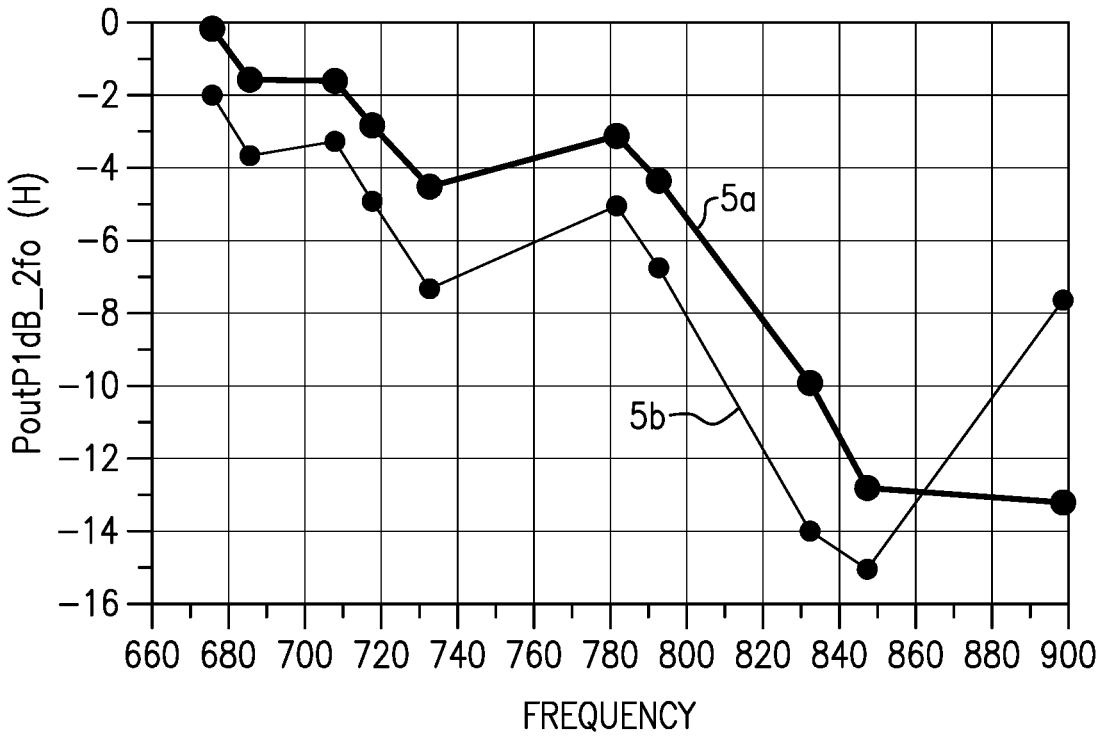

FIG. 5D illustrates an example of an output power of a power amplifier system operating in ET HPM mode according to an example in comparison with a baseline PA.

Figure 5E:
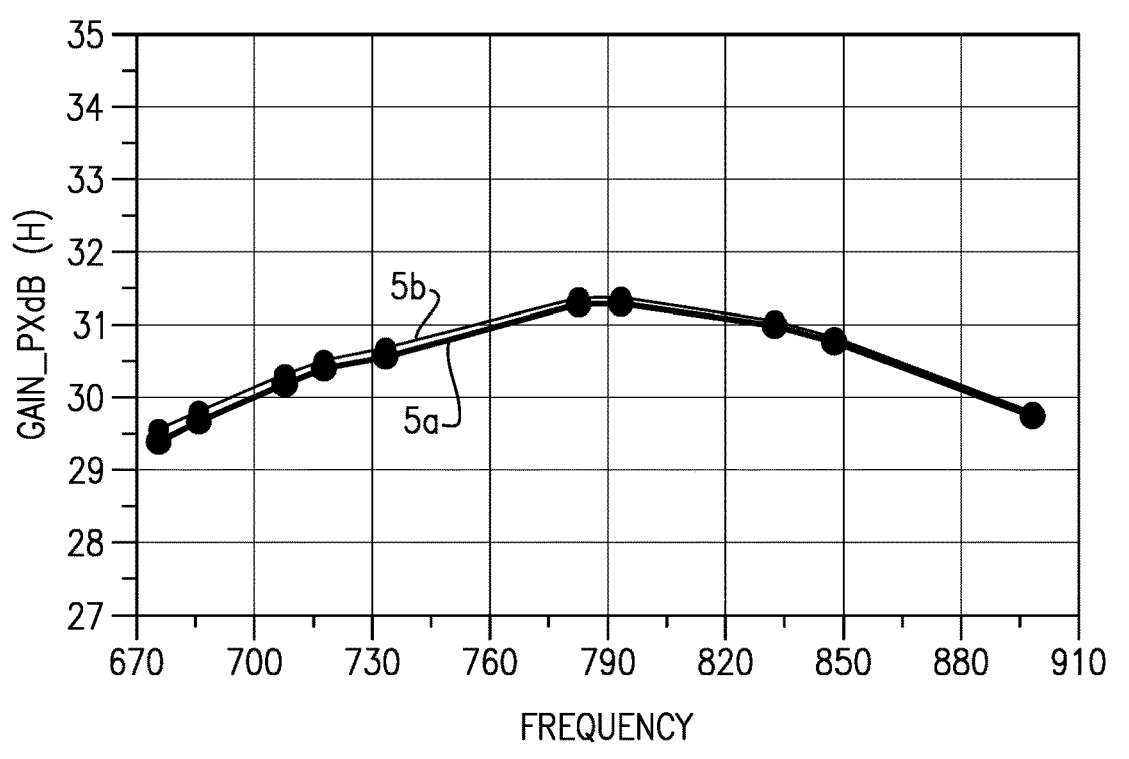

FIG. 5E illustrates an example of a gain of a power amplifier system operating in ET HPM mode according to an example in comparison with a baseline PA.

Figure 5F:
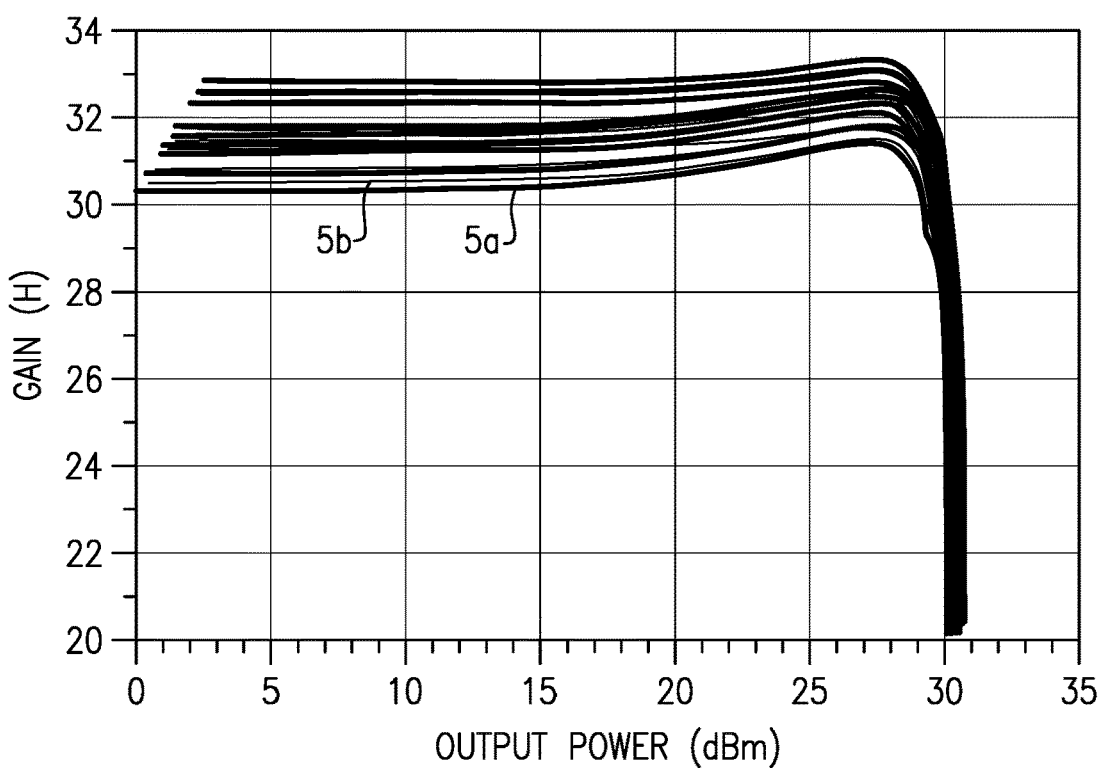

FIG. 5F illustrates an example of a gain of a power amplifier system operating in ET HPM mode according to an example in comparison with a baseline PA.

Figure 5G:
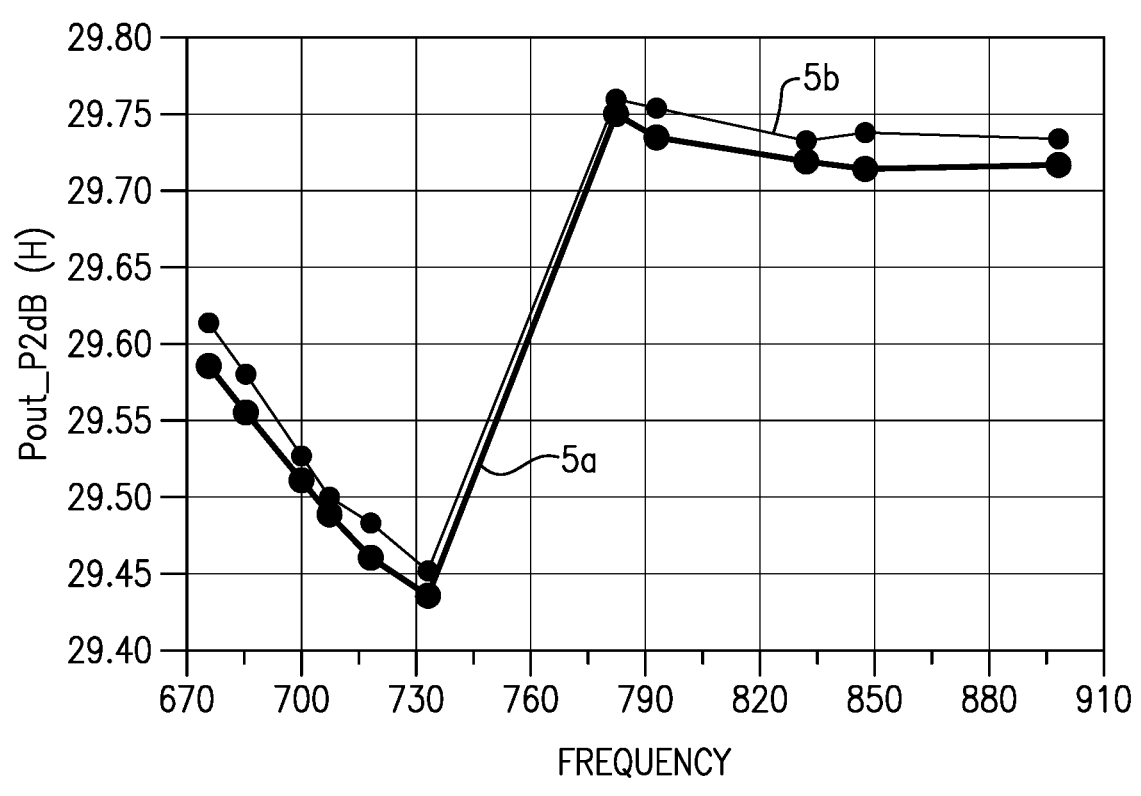

FIG. 5G illustrates an example of output power of a power amplifier system operating in ET HPM mode according to an example in comparison with a baseline PA.

Figure 5H:
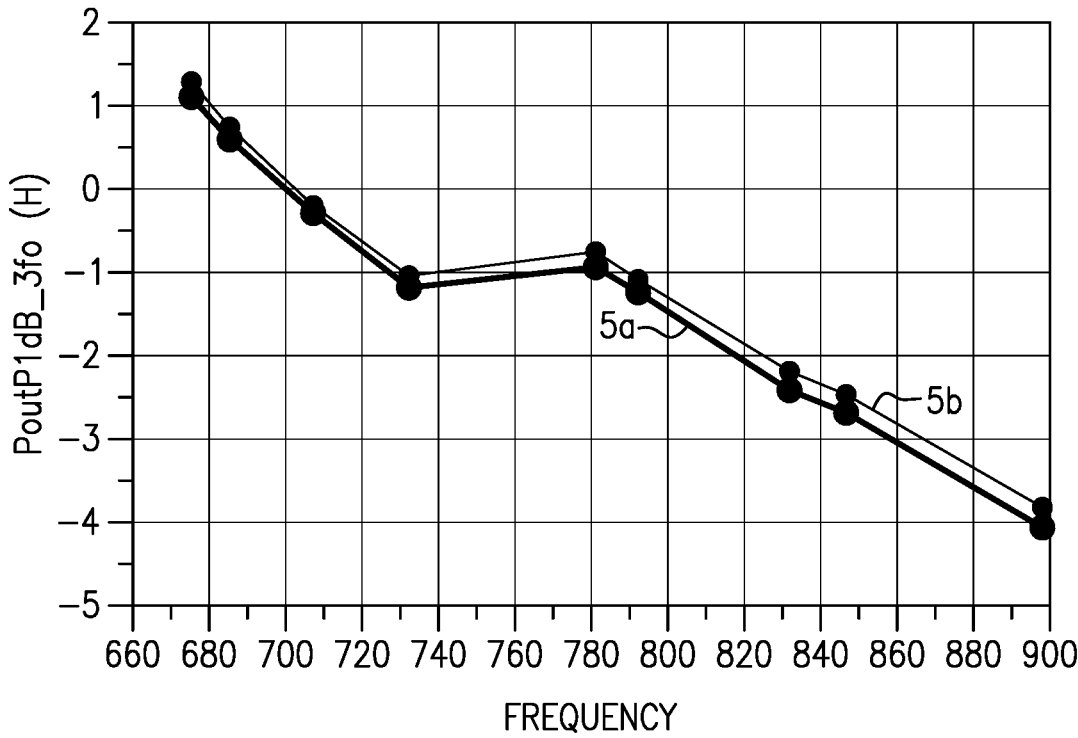

FIG. 5H illustrates an example of an output power of a power amplifier system operating in ET HPM mode according to an example in comparison with a baseline PA.

As shown in FIGS. 5A-5H, other performance characteristics have not been degraded in ET HPM mode. According to an example, in ET HPM mode, all of the output stage amplifiers can be turned on. Accordingly, the adoption of the structure of the output stage circuit assembly according to an example does not have a significant impact on major performance characteristics of the power amplifier system. That is, the output stage circuit assembly may not bring a trade off with other major performance characteristics of the power amplifier system.

Figure 6C:
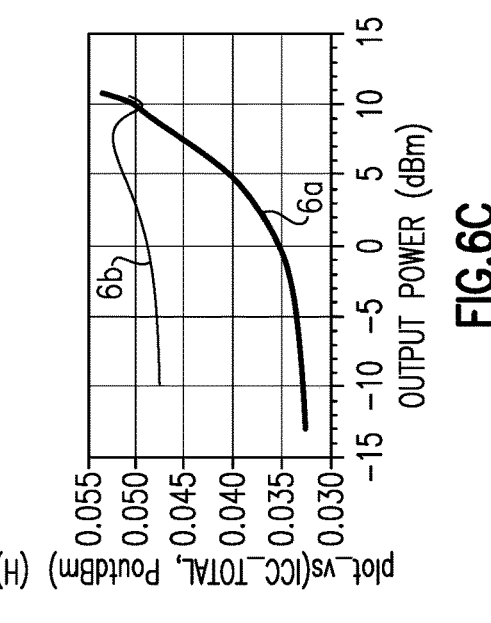
FIGS. 6A-6C illustrate examples of one example of performance characteristics measured from the power amplifier system operating in an average power tracking (APT) low-power mode (LPM).
Figure 6B:
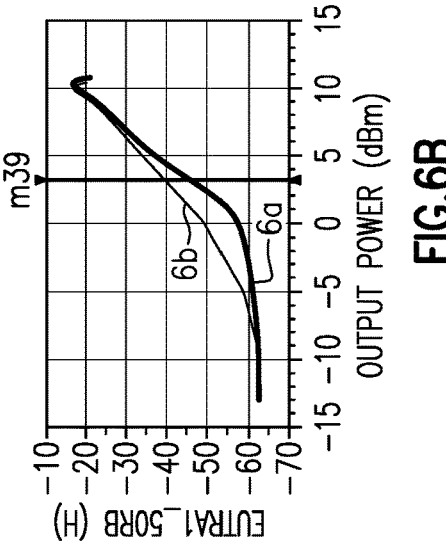
Figure 6A:
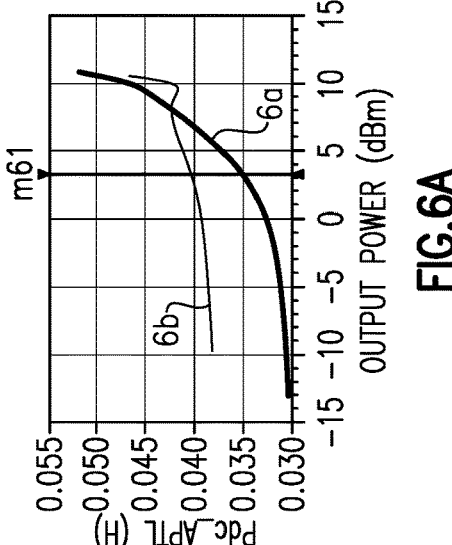

FIGS. 6A-6C illustrate examples of performance characteristics measured from the power amplifier system operating in APT LPM mode. Traces 6a and 6b represent performances of the PA according to an example (trace 6a, the thicker line) and a baseline PA (trace 6b, the thinner line), respectively.

FIG. 6A illustrates an example of power consumption versus output power of power amplifier system operating in APT LPM mode according to an example in comparison with a baseline PA. According to the example described above, in APT LPM mode, three output stage amplifiers can be turned off and only one output stage amplifier can be turned on. As shown in FIG. 6A, since unnecessary output stage amplifiers are turned off, the power consumption of power amplifier system in APT LPM mode can be significantly reduced, in particular with low output power.

FIG. 6B illustrates an example of linearity versus output power of power amplifier system operating in APT LPM mode according to an example in comparison with a baseline PA. As shown in FIG. 6B, the linearity of the power amplifier system according to an example is improved from the baseline PA.

FIG. 6C illustrates an example of output current versus output power of power amplifier system operating in APT LPM mode according to an example in comparison with a baseline PA. As shown in FIG. 6C, the output current of the power amplifier system according to an example is improved from the baseline PA.

According to the examples shown in FIGS. 6A-6C, the power amplifier system operating in APT LPM mode may have specifications as a power range of −40~08.3 dBm, a power consumption of 40 mW, an EUTRA ACLR of −40~13.5 dBm, and a gain of 11-15 dB.

Figure 7C:
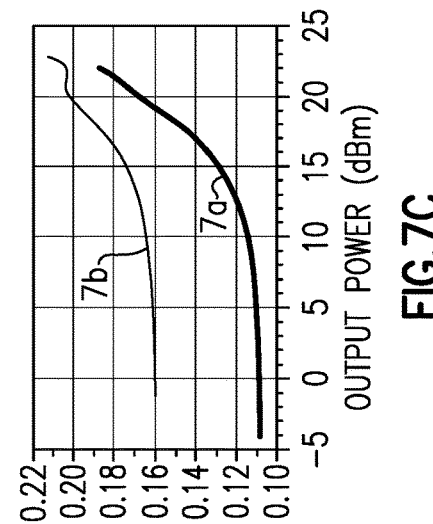
FIGS. 7A-7C illustrate examples of one example of performance characteristics measured from the power amplifier system operating in APT HPM.
Figure 7B:
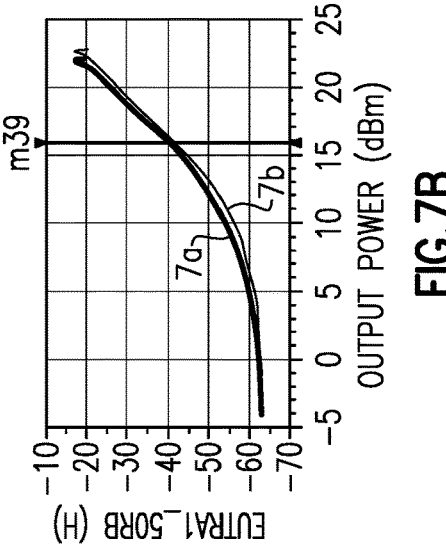
Figure 7A:
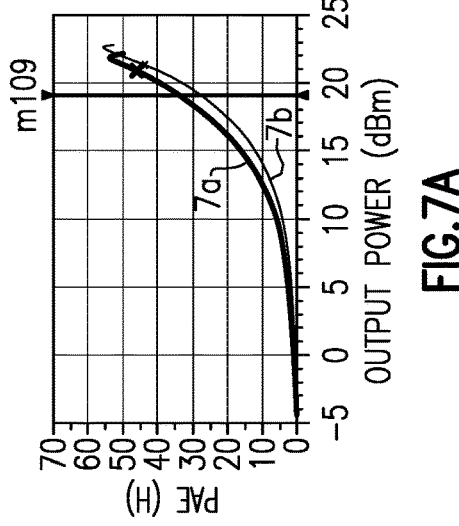

FIGS. 7A-7C illustrate examples of performance characteristics measured from the power amplifier system operating in APT HPM mode.

FIG. 7A illustrates an example of PAE versus output power of power amplifier system operating in APT HPM mode according to an example (trace 7a, the thicker line) in comparison with a baseline PA (trace 7b, the thinner line). According to an example, in APT HPM mode, two output stage amplifiers can be turned off and two output stage amplifiers can be turned on. As shown in FIG. 7A, the PAE of the power amplifier system in APT HPM mode can be improved by 5% compared to a baseline PA.

FIG. 7B illustrates an example of linearity versus output power of the power amplifier system operating in APT HPM mode according to an example (trace 7a) in comparison with a baseline PA (trace 7b). As shown in FIG. 7B, the linearity of the power amplifier system according to an example is improved from the baseline PA.

FIG. 7C illustrates an example of output current versus output power of power amplifier system operating in APT HPM mode according to an example (trace 7a) in comparison with a baseline PA (trace 7b). As shown in FIG. 7C, the output current of the power amplifier system according to an example is improved from the baseline PA.

According to the examples shown in FIGS. 7A-7C, the power amplifier system in APT HPM mode may have specifications as a power range of 6.3~17.3 dBm, a gain of 17.5-19-20.5 dB, and an EUTRA ACLR of −36 dBm.

FIGS. 8A-8C illustrate waveforms for power amplifiers operating in a fixed supply voltage mode, an APT mode, and an ET mode, respectively.

In FIG. 8A, a graph illustrates the voltage of a RF signal 804 and a power amplifier supply voltage 802 versus time for a power amplifier operating in a fixed supply voltage mode. The RF signal 804 has a signal envelope 805. In some examples, it may be desirable that the power amplifier supply voltage 802 of the power amplifier have a voltage level greater than that of the RF signal 804. For example, providing a supply voltage to a power amplifier having a magnitude less than that of the RF signal 804 can clip the signal, thereby creating signal distortion and/or other problems. Thus, it may be advantageous for the power amplifier supply voltage 802 to be greater than that of the signal envelope 805. However, it can be desirable to reduce a difference in voltage between the power amplifier supply voltage 802 and the signal envelope 805 of the RF signal 804, as the area between the power amplifier supply voltage 802 and the signal envelope 805 can represent lost energy, which can reduce battery life and increase heat generated in a mobile device.

FIG. 8B illustrates a graph showing a power amplifier supply voltage 808 that varies or changes in relation to the signal envelope 807 of the RF signal 810. The graph shown in FIG. 8B may correspond to an APT mode of power amplifier operation. In contrast to the power amplifier supply voltage 802 of FIG. 8A, the power amplifier supply voltage 808 of FIG. 8B changes in discrete voltage increments during different time slots, delineated by the dashed lines. The amplifier supply voltage 808 during a particular time slot may be adjusted based on the average power of the envelope 807 during that time slot, for example. For instance, the slot on the right may correspond to a lower power mode of operation than the slot on the left. By lowering the supply voltage during certain time slots, APT operation can improve power efficiency as compared to the fixed supply operation shown in FIG. 8A.

In FIG. 8C, a graph illustrates the voltage of a RF signal 816 and a power amplifier supply voltage 814 versus time. The graph shown in FIG. 8C may correspond to an ET mode of power amplifier operation. In contrast to the power amplifier supply voltage 802 of FIG. 8A, the power amplifier supply voltage 814 of FIG. 8B varies or changes in relation to the signal envelope 815. The area between the power amplifier supply voltage 814 and the signal envelope 815 in FIG. 8C is less than the area between the power amplifier supply voltage 802 and the signal envelope 805 in FIG. 8A, and thus the graph of FIG. 8C can be associated with a power amplifier system having greater energy efficiency. By tracking the supply voltage to the envelope, envelope tracking operation can improve power efficiency as compared to both the fixed supply operation shown in FIG. 8A and the APT mode shown in FIG. 8B.

Figure 9A:
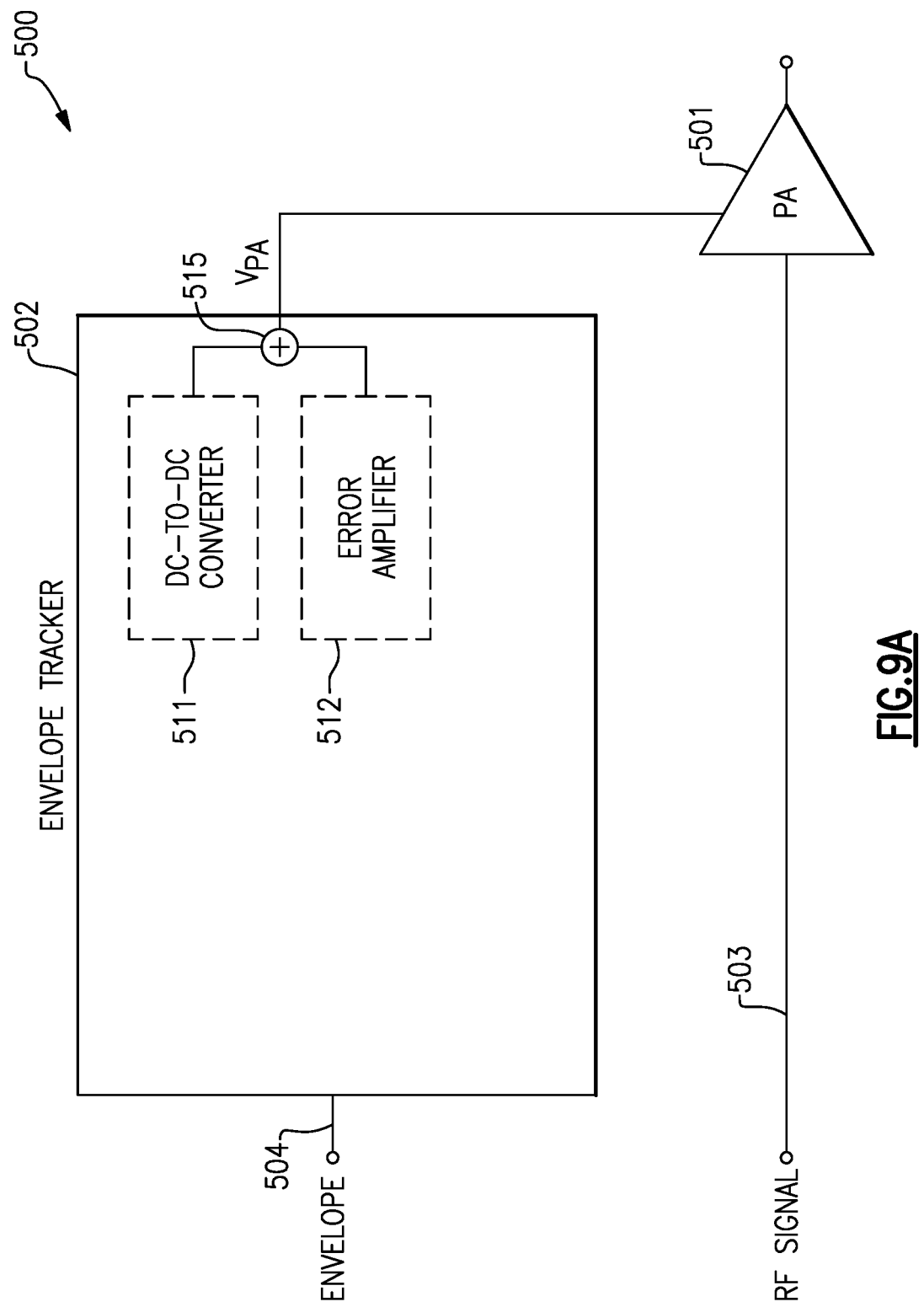
FIGS. 9A-9B illustrate schematic diagrams of an ET system according to one example.

FIG. 9A illustrates a schematic diagram of an ET system 500 according to one example. The ET system 500 includes a power amplifier 501 and an ET 502. The power amplifier 501 provides amplification to a radio-frequency signal 503.

The ET 502 receives an envelope signal 504 corresponding to an envelope of the radio-frequency signal 503. Additionally, the ET 502 generates a power amplifier supply voltage $V_{PA}$, which supplies power to the power amplifier 501.

The illustrated ET 502 includes a DC-to-DC converter 511 and an error amplifier 512 that operate in combination with one another to generate the power amplifier supply voltage $V_{PA}$ based on the envelope signal 504. In the illustrated example, an output of the DC-to-DC converter 511 and an output of the error amplifier 512 are combined using a combiner 515.

The ET 502 of FIG. 9A illustrates one example of analog envelope tracking, in which switching regulators operate in parallel with one another to track an envelope of an RF signal.

Figure 9B:
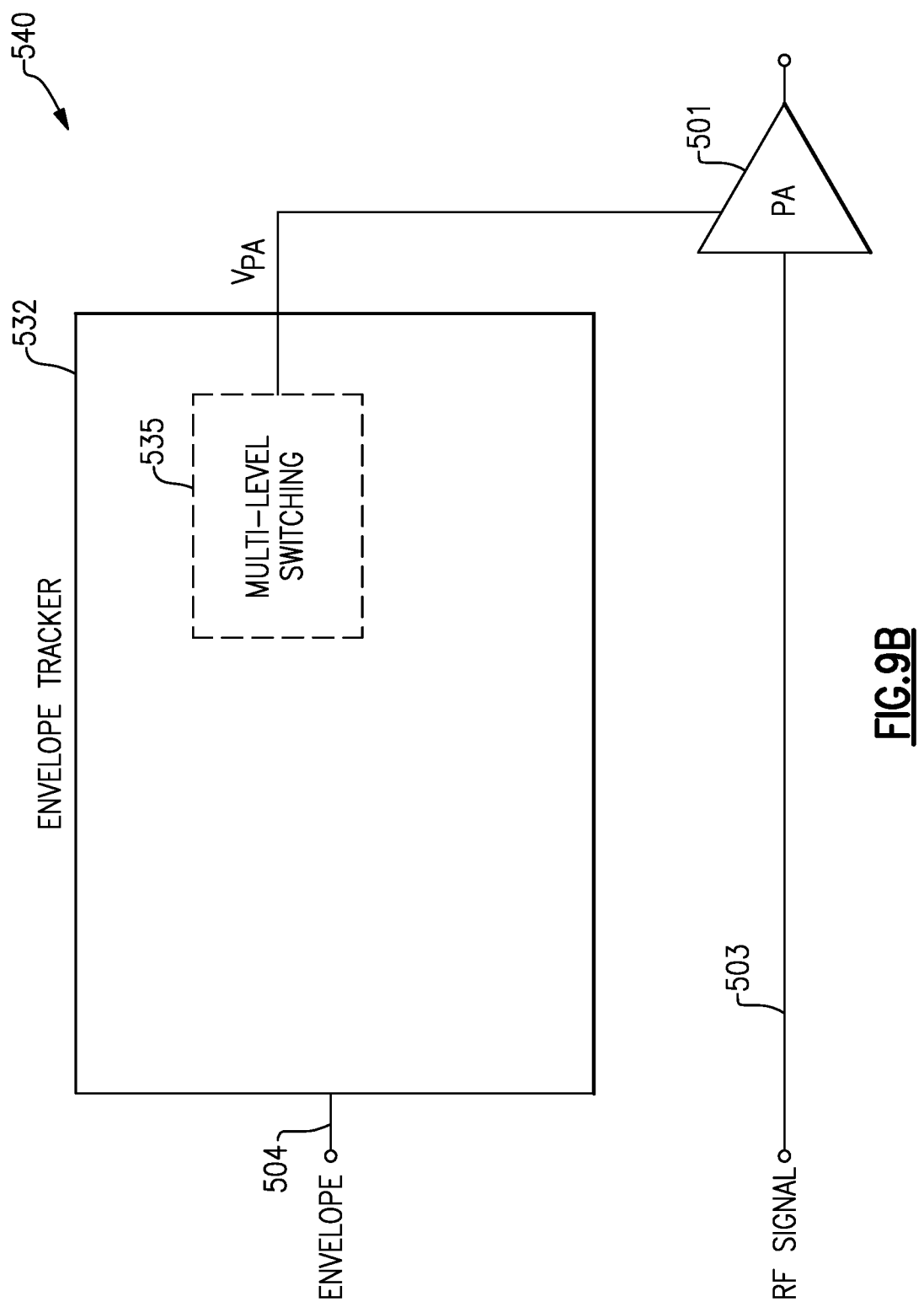

FIG. 9B illustrates a schematic diagram of an ET system 540 according to another example. The ET system 540 includes a power amplifier 501 and an ET 532. The power amplifier 501 provides amplification to a radio-frequency signal 503.

The ET 532 receives an envelope signal 504 corresponding to an envelope of the radio frequency signal 503. Additionally, the ET 532 generates a power amplifier supply voltage $V_{PA}$, which supplies power to the power amplifier 501.

The illustrated ET 532 includes a multi-level switching circuit 535. In certain implementations, the multi-level switching circuit 535 includes a multi-output DC-to-DC converter for generating regulated voltages of different voltage levels, switches for controlling selection of a suitable regulated voltage over time based on the envelope signal, and a filter for filtering the output of the switches to generate the power amplifier supply voltage.

The ET 532 of FIG. 9B illustrates one example of MLS envelope tracking.

Figure 10:
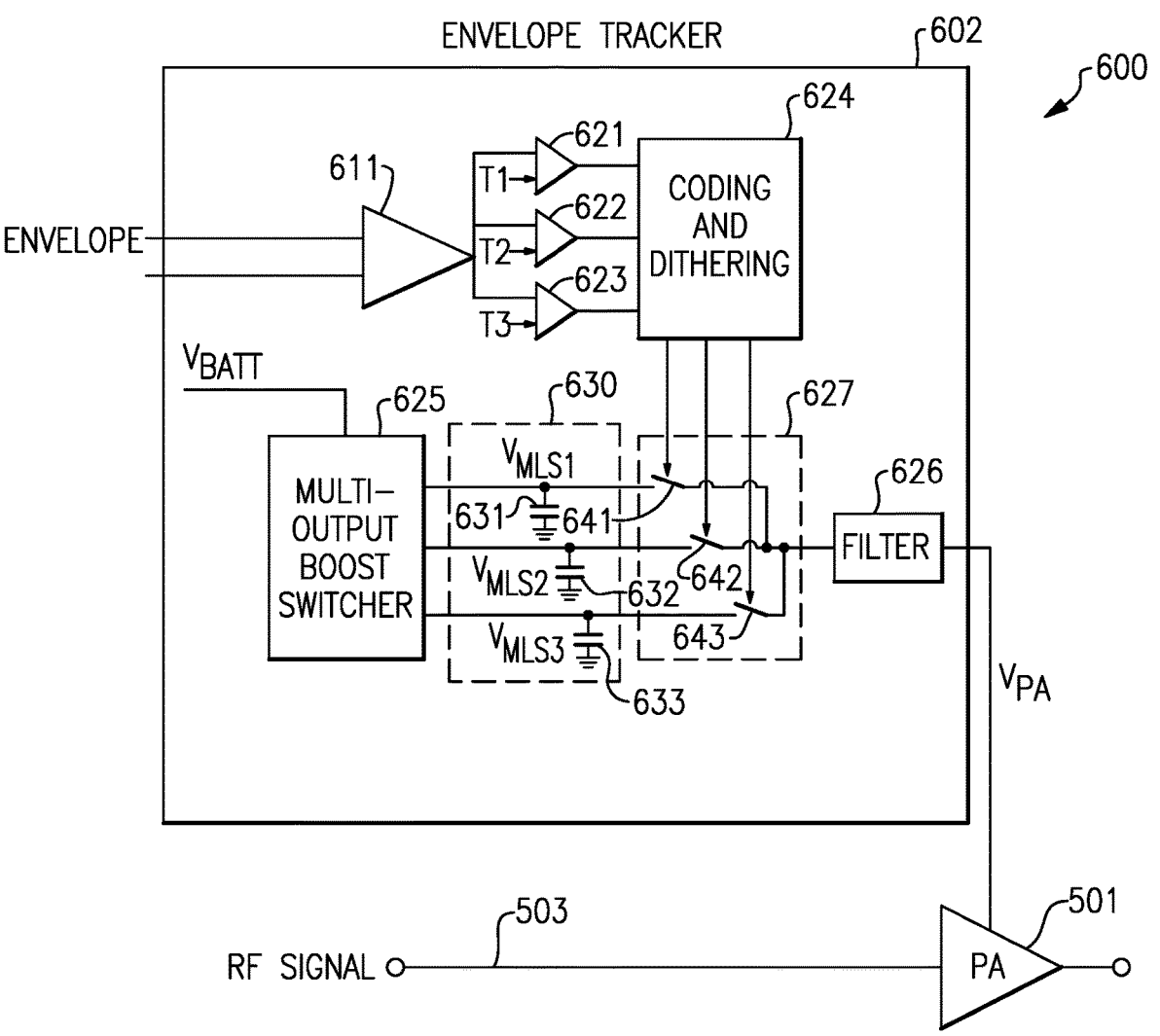
FIG. 10 illustrates a schematic diagram of an ET system according to another example.

FIG. 10 illustrates a schematic diagram of an ET system 600 according to another example. The ET system 600 includes a power amplifier 501 and an ET 602. The power amplifier 501 provides amplification to a radio-frequency signal 503.

The ET 602 receives an envelope signal corresponding to an envelope of the radio frequency signal 503. In this example, the envelope signal is differential. Additionally, the ET 602 generates a power amplifier supply voltage $V_{PA}$, which supplies power to the power amplifier 501.

The illustrated ET 602 includes an envelope amplifier 611, a first comparator 621, a second comparator 622, a third comparator 623, a coding and dithering circuit 624, a multi-output boost switcher 625, a filter 626, a switch bank 627, and a capacitor bank 630. The capacitor bank 630 includes a first capacitor 631, a second capacitor 632, and a third capacitor 633. Additionally, the switch bank 627 includes a first switch 641, a second switch 642, and a third switch 643.

The envelope amplifier 611 amplifies the envelope signal to provide an amplified envelope signal to the comparators 621-623. The comparators 621-623 compare the amplified envelope signal to a first threshold T1, a second threshold T2, and a third threshold T3, respectively. The results of the comparisons are provided to the coding and dithering circuit 624, which processes the results to control selection of switches of the switch bank 627. The coding and dithering circuit 624 can activate the switches while using coding and/or dithering to reduce artifacts arising from opening and closing the switches.

Although an example with three comparators is shown, more or fewer comparators can be used. Furthermore, the coding and dithering circuit 624 can be omitted in favor of controlling the switch bank in other ways. In a first example, coding but not dithering is used. In a second example, dithering but not coding is used. In a third example, neither coding nor dithering is used.

The multi-output boost switcher 625 generates a first regulated voltage $V_{MLS1}$, a second regulated voltage $V_{MLS2}$, and a third regulated voltage $V_{MLS3}$ based on providing DC-to-DC conversion of a battery voltage $V_{BATT}$. Although an example with three regulated voltages is shown, the multi-output boost switcher 625 can generate more or fewer regulated voltages. In certain implementations, at least a portion of the regulated voltages are boosted relative to the battery voltage VBATT. In some configurations, one or more of the regulated voltages is a buck voltage having a voltage lower than the battery voltage VBATT.

The capacitor bank 630 aids in stabilizing the regulated voltages generated by the multi-output boost switcher 625. For example, the capacitors 631-633 may operate as decoupling capacitors.

The filter 626 processes the output of the switch bank 627 to generate the power amplifier supply voltage $V_{PA}$. By controlling the selection of the switches 641-643 over time based on the envelope signal, the power amplifier supply voltage $V_{PA}$ is generated to track the envelope signal.

Figure 11A:
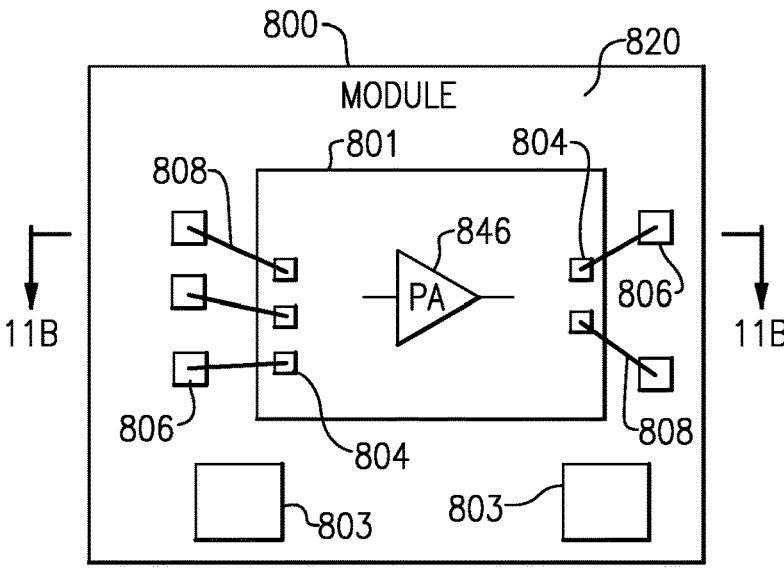
FIG. 11A illustrates a schematic diagram of one example of a packaged module.
Figure 11B:
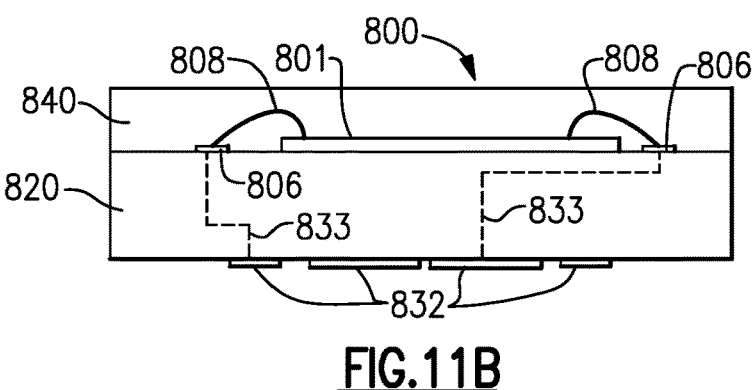
FIG. 11B illustrates a schematic diagram of a cross-section of the packaged module of FIG. 11A taken along the lines 11B-11B.

FIG. 11A illustrates a schematic diagram of one example of a packaged module 800. FIG. 11B illustrates a schematic diagram of a cross-section of the packaged module 800 of FIG. 11A taken along the lines 11B-11B.

The packaged module 800 includes an IC or die 801, surface mount components 803, wirebonds 808, a package substrate 820, and encapsulation structure 840. The package substrate 820 includes pads 806 formed from conductors disposed therein. Additionally, the die 801 includes pads 804, and the wirebonds 808 have been used to electrically connect the pads 804 of the die 801 to the pads 806 of the package substrate 801.

The die 801 includes a power amplifier system, which can be implemented in accordance with any of the examples herein.

The packaging substrate 820 can be configured to receive a plurality of components such as the die 801 and the surface mount components 803, which can include, for example, surface mount capacitors and/or inductors.

As shown in FIG. 11B, the packaged module 800 is shown to include a plurality of contact pads 832 disposed on the side of the packaged module 800 opposite the side used to mount the die 801. Configuring the packaged module 800 in this manner can aid in connecting the packaged module 800 to a circuit board such as a phone board of a wireless device. The example contact pads 832 can be configured to provide RF signals, bias signals, power low voltage(s) and/or power high voltage(s) to the die 801 and/or the surface mount components 803. As shown in FIG. 11B, the electrically connections between the contact pads 832 and the die 801 can be facilitated by connections 833 through the package substrate 820. The connections 833 can represent electrical paths formed through the package substrate 820, such as connections associated with vias and conductors of a multilayer laminated package substrate.

In some examples, the packaged module 800 can also include one or more packaging structures to, for example, provide protection and/or facilitate handling of the packaged module 800. Such a packaging structure can include overmold or encapsulation structure 840 formed over the packaging substrate 820 and the components and die(s) disposed thereon.

Although the packaged module 800 is described in the context of electrical connections based on wirebonds, one or more features of the present disclosure can also be implemented in other packaging configurations, including, for example, flip-chip configurations.

Figure 12:
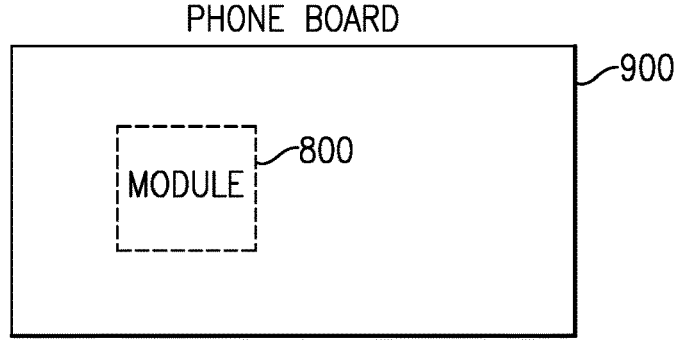
FIG. 12 illustrates a schematic diagram of one example of a phone board.

FIG. 12 illustrates a schematic diagram of one example of a phone board 900. The phone board 900 includes the module 800 shown in FIGS. 11A-11B attached thereto. Although not illustrated in FIG. 12 for clarity, the phone board 800 can include additional components and structures.

Some of the examples described above have provided examples in connection with wireless devices or mobile phones. However, the principles and advantages of the examples can be used for any other systems or apparatus that have needs for power amplifiers.

Such envelope trackers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain examples include, while other examples do not include, certain features, elements and/or states. Thus, such conditional language is not generally intended to imply that features, elements and/or states are in any way required for one or more examples or that one or more examples necessarily include logic for deciding, with or without author input or prompting, whether these features, elements and/or states are included or are to be performed in any particular example.

The above detailed description of examples of the invention is not intended to be exhaustive or to limit the invention to the precise form disclosed above. While specific examples of, and examples for, the invention are described above for illustrative purposes, various equivalent modifications are possible within the scope of the invention, as those skilled in the relevant art will recognize. For example, while processes or blocks are presented in a given order, alternative examples may perform routines having steps, or employ systems having blocks, in a different order, and some assembly, a drain node connected to a base of a respective transistor, and a gate connected to the controller.

8. The output stage circuit assembly of claim 6 wherein each transistor includes a collector connected to a DC voltage bias node and an emitter connected to an output node of each output stage amplifier of the plurality of output stage amplifiers.

9. The output stage circuit assembly of claim 8 wherein the output stage amplifiers of the plurality of output stage amplifiers are connected to each other via a first connection node at the input of the output stage circuit assembly, a second connection node at the DC voltage bias node, and a third connection node connected to an emitter of each transistor via a resistor.

10. A radio-frequency module comprising:
a packaging substrate configured to receive a plurality of components;
a power amplifier system implemented on the packaging substrate, the power amplifier system including an output stage circuit assembly, the output stage circuit assembly including a plurality of output stage amplifiers connected in parallel to each other, each output stage amplifier of the plurality of output stage amplifiers configured to amplify an input signal of the output stage circuit assembly when turned on; and
a controller configured to
select a selected voltage supplying mode for the power amplifier system from a plurality of voltage supplying modes,
select a selected power management mode of a device in which the power amplifier system is embedded from a plurality of power management modes, and
determine a number of output stage amplifiers to be turned off based on the selected voltage supplying mode and based on the selected power management mode, and to control the plurality of output stage amplifiers to be turned on or off according to the determined number of output stage amplifiers to be turned off.

11. The radio-frequency module of claim 10 wherein the radio-frequency module is a front-end module.

12. The radio-frequency module of claim 10 wherein the plurality of voltage supplying modes includes an average power tracking (APT) mode and an envelope tracking (ET) mode.

13. The radio-frequency module of claim 12 wherein the controller is configured to determine to turn off more output stage amplifiers for the APT mode than the ET mode.

14. The radio-frequency module of claim 10 wherein the plurality of power management modes includes a low power mode, a medium power mode, and a high power mode.

15. The radio-frequency module of claim 14 wherein the controller is configured to determine to turn off more output stage amplifiers for a lower power consumption mode than a higher power consumption mode.

16. The radio-frequency module of claim 10 wherein each output stage amplifier of the plurality of output stage amplifiers includes a transistor configured to amplify the input signal and a switch configured to operate the transistor.

17. The radio-frequency module of claim 16 wherein the switch is a metal-oxide semiconductor having a source node connected to an input of the output stage circuit assembly, a drain node connected to a base of a respective transistor, and a gate connected to the controller.

18. The radio-frequency module of claim 16 wherein the transistor includes a collector connected to a DC voltage

What is claimed is:

1. An output stage circuit assembly for a power amplifier system, the output stage circuit assembly comprising:
a plurality of output stage amplifiers connected in parallel to each other, each output stage amplifier of the plurality of output stage amplifiers configured to amplify an input signal of the output stage circuit assembly when turned on; and
a controller configured to
select a selected voltage supplying mode for the power amplifier system from a plurality of voltage supplying modes,
select a selected power management mode of a device in which the power amplifier system is embedded from a plurality of power management modes, and
determine a number of output stage amplifiers to be turned off based on the selected voltage supplying mode and based on the selected power management mode, and to control the plurality of output stage amplifiers to be turned on or off according to the determined number of output stage amplifiers to be turned off.

2. The output stage circuit assembly of claim 1 wherein the plurality of voltage supplying modes includes an average power tracking (APT) mode and an envelope tracking (ET) mode.

3. The output stage circuit assembly of claim 2 wherein the controller is configured to determine to turn off more output stage amplifiers for the APT mode than the ET mode.

4. The output stage circuit assembly of claim 1 wherein the plurality of power management modes includes a low power mode, a medium power mode, and a high power mode.

5. The output stage circuit assembly of claim 4 wherein the controller is configured to determine to turn off more output stage amplifiers for a lower power consumption mode than a higher power consumption mode.

6. The output stage circuit assembly of claim 1 wherein each output stage amplifier of the plurality of output stage amplifiers includes a transistor configured to amplify the input signal and a switch configured to operate the transistor.

7. The output stage circuit assembly of claim 6 wherein each switch is a metal-oxide semiconductor having a source node connected to an input of the output stage circuit bias node and an emitter connected to an output node of each output stage amplifier of the plurality of output stage amplifiers.

19. The radio-frequency module of claim 18 wherein the output stage amplifiers are connected to each other via a first connection node at the input of the output stage circuit assembly, a second connection node at the DC voltage bias node, and a third connection node connected to an emitter of the transistor via a resistor.

20. A method of operating an output stage circuit assembly for a power amplifier system, the output stage circuit assembly including a plurality of output stage amplifiers connected in parallel to each other, the method comprising:

amplifying, by each output stage amplifier of the plurality of output stage amplifiers responsive to being turned on, an input signal of the output stage circuit assembly;

selecting a selected voltage supplying mode for the power amplifier system from a plurality of voltage supplying modes;

selecting a selected power management mode of a device in which the power amplifier system is embedded from a plurality of power management modes;

determining a number of output stage amplifiers to be turned off based on the selected voltage supplying mode and based on the selected power management mode; and controlling the plurality of output stage amplifiers to be turned on or off according to the determined number of output stage amplifiers to be turned off.

\* \* \* \* \*